(12) United States Patent
Wymore et al.

(10) Patent No.: US 11,495,724 B2
(45) Date of Patent: Nov. 8, 2022

(54) SUPERCONDUCTING STRUCTURE AND DEVICE SURFACE TERMINATION WITH ALLOY

(71) Applicant: INTERNATIONAL BUSINESS MACHINES CORPORATION, Armonk, NY (US)

(72) Inventors: Benjamin Wymore, Cortlandt Manor, NY (US); Christian Lavoie, Pleasantville, NY (US); Markus Brink, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 150 days.

(21) Appl. No.: 16/935,078

(22) Filed: Jul. 21, 2020

(65) Prior Publication Data

US 2022/0029083 A1    Jan. 27, 2022

(51) Int. Cl.
  *H01L 39/02* (2006.01)
  *G06N 10/00* (2022.01)
  *H01L 39/12* (2006.01)
  *H01L 39/22* (2006.01)
  *H01L 39/24* (2006.01)

(52) U.S. Cl.
  CPC .......... *H01L 39/025* (2013.01); *G06N 10/00* (2019.01); *H01L 39/125* (2013.01); *H01L 39/223* (2013.01); *H01L 39/2493* (2013.01)

(58) Field of Classification Search
  CPC ... H01L 39/025; H01L 39/125; H01L 39/223; H01L 39/2493; H01L 39/2409; G06N 10/00
  See application file for complete search history.

(56) References Cited

U.S. PATENT DOCUMENTS

| | | |
|---|---|---|
| 3,328,200 A | 6/1967 | Neugebauer |
| 5,116,811 A | 5/1992 | Abe et al. |
| 5,212,152 A | 5/1993 | Lyon et al. |
| 8,437,818 B1 | 5/2013 | Tolpygo et al. |
| 9,425,376 B2 | 8/2016 | Greer et al. |
| 10,367,132 B2 | 7/2019 | Krogstrup et al. |
| 10,453,894 B2 | 10/2019 | Ladizinsky et al. |
| 2019/0259931 A1 | 8/2019 | Megrant |

FOREIGN PATENT DOCUMENTS

| | | |
|---|---|---|
| WO | 2017217958 A1 | 12/2017 |
| WO | 2018106215 A1 | 6/2018 |
| WO | 2018236374 A1 | 12/2018 |

OTHER PUBLICATIONS

Barzi, E. et al., "Synthesis of Superconducting Nb3Sn Coatings on Nb Substrates"; Superconducting Science and Technology, IOP (2015); vol. 29:1, 12 pgs.
International Search Report dated Nov. 3, 2021 in related application PCT/EP2021/070173, 4 pgs.

*Primary Examiner* — Matthew L Reames
(74) *Attorney, Agent, or Firm* — Intelletek Law Group, PLLC; Gabriel Daniel, Esq.

(57) ABSTRACT

A method of fabricating a superconductor device includes providing a first metal layer on top of the substrate. An oxidation of a top surface of the first metal layer is rejected. A second metal layer is deposited on top of the second metal layer. A superconducting alloy of the first metal layer and the second metal layer is created between the first metal layer and the second metal layer. There is no oxide layer between the superconducting alloy and the first metal layer.

15 Claims, 5 Drawing Sheets

SUPERCONDUCTING STRUCTURE AND DEVICE SURFACE TERMINATION WITH ALLOY

BACKGROUND

Technical Field

The present disclosure generally relates to quantum computing, and more particularly, to superconducting structures and methods of creation thereof.

Description of the Related Art

Superconducting quantum computing is an implementation of a quantum computer in superconducting electronic circuits. Quantum computation studies the application of quantum phenomena for information processing and communication. Various models of quantum computation exist, and the most popular models include the concepts of qubits and quantum gates. A qubit is a generalization of a bit that has two possible states, but can be in a quantum superposition of both states. A quantum gate is a generalization of a logic gate, however the quantum gate describes the transformation that one or more qubits will experience after the gate is applied on them, given their initial state. Various quantum phenomena, such as superposition and entanglement, do not have analogs in the world of classical computing and therefore may involve special structures, techniques, and materials.

SUMMARY

According to an embodiment, superconductor device includes a first metal layer on top of a substrate. A second metal layer is on top of the first metal layer. A superconducting alloy of the first metal layer and the second metal layer is between the first metal layer and the second metal layer. There is no oxide layer between the superconducting alloy and the first metal layer.

In one embodiment, the first metal layer is Niobium (Nb), the second metal layer is Aluminum (Al), and the superconducting alloy is $Al_3Nb$.

In one embodiment, an orientation of crystal grains of the superconducting alloy is substantially aligned with a (002) plane parallel to a surface of the substrate metal layer.

In one embodiment, there is an electrode on top of the second metal layer.

In one embodiment, the electrode is a Josephson Junction electrode.

In one embodiment, the superconducting alloy is operative to protect the first metal layer from oxidation or contamination that could affect a performance of the superconductor device.

According to an embodiment, a method of fabricating a superconductor device includes providing a first metal layer on top of a substrate. An oxidation of a top surface of the first metal layer is rejected. A second metal layer is deposited on top of the second metal layer. A superconducting alloy of the first metal layer and the second metal layer is created between the first metal layer and the second metal layer. There is no oxide layer between the superconducting alloy and the first metal layer.

In one embodiment, rejecting the oxidation of the top surface of the first metal layer includes the second metal layer being placed on top of the first metal layer before a top surface of the first metal layer is exposed to air, after the deposition of the first metal layer.

In one embodiment, rejecting the oxidation of the top surface of the first metal layer further includes maintaining the superconductor device in a vacuum between a deposition of the first metal layer and a deposition of the second metal layer.

In one embodiment, rejecting the oxidation of the top surface of the first metal layer includes the second metal layer being deposited on top of the first metal layer after a top surface of the first metal layer being exposed to air, and subsequent to a cleaning of the top surface of the first superconductor metal, to remove any oxidation therefrom.

In one embodiment, the second metal layer is etched away after the creation of the superconducting alloy.

In one embodiment, the creation of the superconducting alloy includes annealing the first metal layer and the second superconductor metal at a predetermined temperature.

In one embodiment, the superconducting alloy creates an electrical path from the first metal layer to the second metal layer.

In one embodiment, an orientation of a lattice of the superconducting alloy is (002), (112), or (101), depending on a temperature of an anneal of the first metal layer and the second metal layer, to create the superconducting alloy.

In one embodiment, an electrode is deposited on top of the second metal layer.

In one embodiment, the electrode is a Josephson Junction electrode.

In one embodiment, the second metal layer is removed and an electrode is deposited on top of the superconducting alloy.

According to an embodiment, a method of fabricating a superconductor device includes providing a first metal layer on top of a substrate. An initial oxide layer is provided on a top surface of the first metal layer. A second metal layer is deposited on top of the second metal layer. A superconducting alloy of the first metal layer and the second metal layer is created between the first metal layer and the second metal layer. The initial oxide layer is moved to a top surface of the superconducting alloy during the creation of the superconducting alloy.

In one embodiment, the initial oxide on the top surface of the superconducting alloy and the second metal layer are removed. An electrode is deposited on top of the superconducting alloy.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the orientation of the Figures being described. Since components of embodiments of the disclosure can be positioned in a number of different orientations, the directional terminology is used for purposes of illustration and is in no way limiting. Thus, it will be understood that the spatially relative terminology is intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

As used herein, the terms "lateral" and "horizontal" describe an orientation parallel to a first surface of a chip.

As used herein, the term "vertical" describes an orientation that is arranged perpendicular to the first surface of a chip, chip carrier, or semiconductor body.

As used herein, the terms "coupled" and/or "electrically coupled" are not meant to mean that the elements must be directly coupled together—intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

As used herein, certain terms are used indicating what may be considered an idealized behavior, such as, for example, "lossless," "superconductor," or "superconducting," which are intended to cover functionality that may not be exactly ideal but is within acceptable margins for a given application. For example, a certain level of loss or tolerance may be acceptable such that the resulting materials and structures may still be referred to by these "idealized" terms.

The concepts herein relate to quantum technology and quantum chips. Regarding quantum technology, the electromagnetic energy associated with a qubit can be stored, for example, in so-called Josephson junctions and in the capacitive and inductive elements that are used to form the qubit. In other examples, there may be spin qubits coupled to resonators or topological qubits, microfabricated ion traps, etc. Other types of superconducting components are supported by the teachings herein as well, including (without limitation), circulators, isolators, amplifiers, filters, active control electronics such as rapid single flux quantum (RSFQ), etc.

In one example, to read out the qubit state, a microwave signal is applied to the microwave readout cavity that couples to the qubit at the cavity frequency. The transmitted (or reflected) microwave signal goes through multiple thermal isolation stages and low-noise amplifiers that are used to block or reduce the noise and improve the signal-to-noise ratio. The amplitude and/or phase of the returned/output microwave signal carries information about the qubit state, such as whether the qubit has dephased to the ground or excited state. The microwave signal carrying the quantum information about the qubit state is usually weak (e.g., on the order of a few microwave photons). Various circuits and techniques can be used to measure this weak signal. For example, low-noise quantum-limited amplifiers (QLAs), such as Josephson amplifiers and travelling-wave parametric amplifiers (TWPAs), may be used as preamplifiers at the output of the quantum system to boost the quantum signal, while adding the minimum amount of noise as dictated by quantum mechanics, in order to improve the signal to noise ratio of the output chain. In addition to Josephson amplifiers, certain Josephson microwave components that use Josephson amplifiers or Josephson mixers such as Josephson circulators, Josephson isolators, and Josephson mixers can be used in scalable quantum processors. Accordingly, Josephson Junctions are salient circuit elements of a superconducting quantum computer. A Josephson Junction may include a thin layer of insulator, sometimes referred to as a barrier or a tunnel barrier, between two layers of superconductor. The Josephson Junction acts as a superconducting tunnel junction.

A qubit system may include one or more readout resonators coupled to the qubit. A readout resonator may be a transmission line that includes a capacitive connection to ground on one side and is either shorted to the ground on the other side, such as for a quarter wavelength resonator, or may have a capacitive connection to ground, such as for a half wavelength resonator, which results in oscillations within the transmission line, with the resonant frequency of the oscillations being close to the frequency of the qubit. For example, the readout resonator affects a pulse coming from the control/measurement instruments at the readout resonator frequency. The pulse acts as a measurement that decoheres the qubit and makes it collapse into a state of "one" or "zero," thereby imparting a phase shift on that measurement pulse.

Between qubits there may be a coupling resonator, which allows coupling different qubits together in order to realize quantum logic gates. The coupling resonator is typically structurally similar to the readout resonator in that it is a transmission line that includes capacitive connections to ground on both sides, which also results in oscillations within the coupling resonator. When a qubit is implemented as a transmon, each side of the coupling resonator is coupled (e.g., capacitively or inductively) to a corresponding qubit by being in adequate proximity to (e.g., the capacitor of) the qubit. Since each side of the coupling resonator has coupling with a respective different qubit, the two qubits are coupled together through the coupling resonator. In this way, there is mutual interdependence in the state between coupled qubits, thereby allowing a coupling resonator to use the state of one qubit to control the state of another qubit. Entanglement occurs when the interaction between two qubits is such that the states of the two cannot be specified independently, but can only be specified for the whole system. In this way, the states of two qubits are linked together such that a measurement of one of the qubits, causes the state of the other qubit to collapse.

Typical materials to make the interconnects include, without limitation, niobium (Nb), aluminum (Al), niobium nitride (NbN), titanium nitride (TiN), niobium titanium nitride (NbTiN), etc., sometimes referred to herein as superconductors. It will be understood that other suitable materials that have superconducting properties can be used as well.

Applicants have recognized that to increase the computational power and reliability of a quantum computer in general, and superconductor structures in particular, improvements can be made in superconductor device structure and manufacture of the same. Achieving low error rates and better reliability is relevant, among other aspects, to manipulate qubit states accurately and perform sequential operations that provide consistent results and not merely unreliable data. Quantum technology is still a developing field and providing structures with highly predictable and more ideal performance is a challenge.

In one aspect, the teachings herein are based on Applicants' insight that protecting specific interfaces of superconductors used in superconducting quantum circuits from oxidation can improve the decoherence and signal integrity of superconducting qubits. Applicants have further recognized that directly applying conventional integrated circuit techniques for protecting materials from oxidation to superconducting quantum circuits may not be effective because of the unique challenges presented by quantum circuits that are not presented in classical computing architectures. Accordingly, embodiments of the present disclosure are further based on recognition that issues unique to quantum circuits have been taken in consideration when evaluating applicability of conventional integrated circuit techniques to building superconducting quantum circuits, and, in particular, to electing materials and processes used for protecting superconducting materials of such circuits from oxidation.

Figures 1A, 1B:
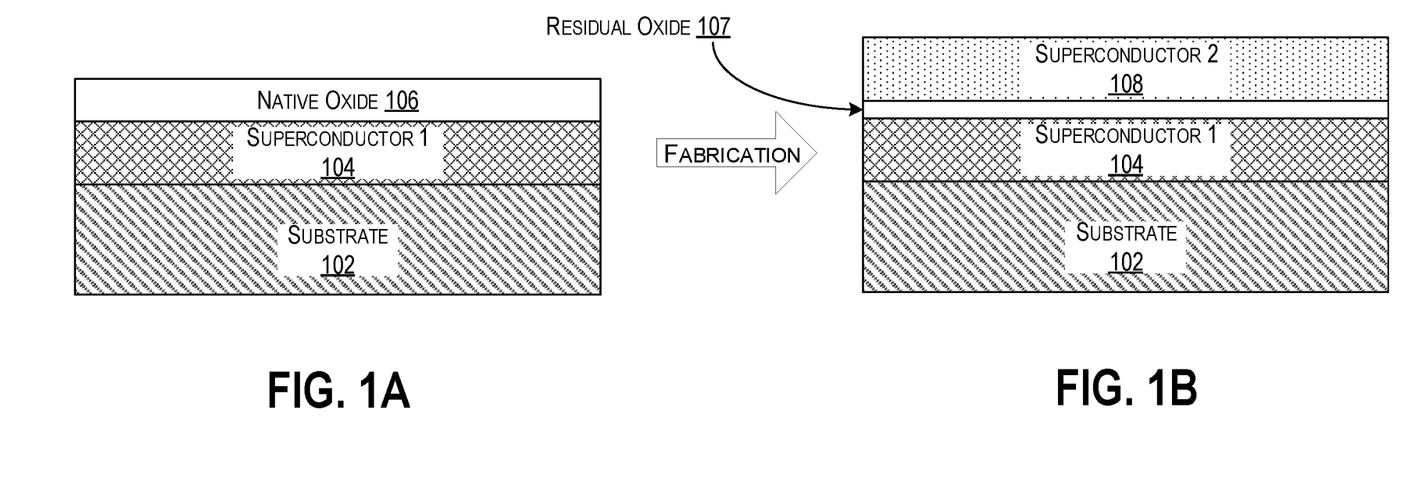
FIG. 1A illustrates a first superconductor layer on top of a substrate.
FIG. 1B illustrates a residual oxide layer on top of a first superconductor layer.

The surface of the superconductor of a quantum circuit include possible lossy material due to oxide growth or surface contamination that reduces the resonator quality. In this regard, FIG. 1A illustrates a first superconductor layer 104 on top of a substrate 102. The surface oxide 106 may grow naturally and is therefore sometimes referred to herein as native oxide. As illustrated in FIG. 1B, when another superconductor layer 108 is placed on top (e.g., in the formation of a Josephson Junction), there is a remaining residual oxide 107.

Contact between superconducting elements, for example a capacitor pad and a Josephson Junction electrode that may be implemented by superconductor layers 104 and 108, is salient for good qubit performance. However, the residual oxides or surface contamination 107 in the contact area can lower qubit coherence. For example, semiconductor processes often involve different chambers for different depositions and vacuum is often broken, which immediately may result in the native oxide 107 discussed herein. One way of removing the native oxide 107 is by way of in situ cleaning (e.g., ion mill, sputter clean, vacuum bake, vapor HF, etc.). However, there are limitations to the level of cleanliness that can be achieved. For example, Vapor HF is not typically done in vacuum (but can be), so the removal of oxide is followed by some time in air before load in a deposition chamber. Oxide formation may thus be limited but not eliminated. As to ion milling, it is performed in vacuum but, since it is a sputtering removal of oxide, it may also lead to some redeposition.

Accordingly, the teachings herein provide methods and systems of mitigating loss in contact superconductors of quantum circuits. The techniques described herein may be implemented in a number of ways. Example implementations are provided below with reference to the following figures.

Example Superconducting Structure

Figure 2:
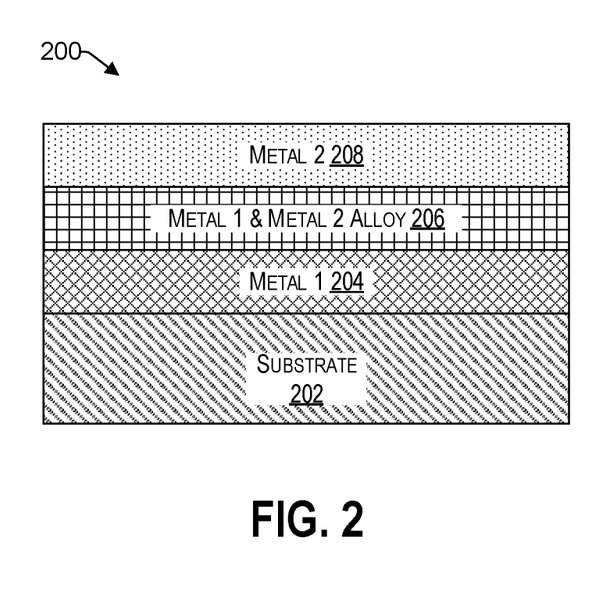
FIG. 2 is a simplified cross-section view of a superconducting structure, consistent with an illustrative embodiment.

Reference now is made to FIG. 2, which is a simplified cross-section view of a superconducting structure 200, consistent with an illustrative embodiment. Superconductor structure 200 can be used to implement various superconducting circuits, including, without limitation, a Josephson Junction (JJ), superconducting capacitors, circulators, isolators, amplifiers, filters, etc. To facilitate the present discussion, the superconducting structures herein will sometimes be discussed in the context of a JJ, while it will be understood that other superconducting structures are supported as well.

The superconductor structure 200 may include a substrate 202. In various embodiments, the substrate 202 may comprise any suitable material or combination of materials, such as doped or undoped silicon, glass, dielectrics, etc. For example, the substrate may comprise a Silicon-on-insulator (SOI) structure, e.g., with a buried insulator layer, or a bulk material substrate, e.g., with appropriately doped regions, typically referred to as wells. In another embodiment, the substrate may be silicon with silicon oxide, nitride, or any other insulating films on top.

Other materials that may be used for the substrate include, without limitation, sapphire, aluminum oxide, germanium, gallium arsenide (GaAs) or any of the other III-V periodic table compounds, indium phosphide (InP), silicon carbide (SiC), a superconducting alloy of silicon and germanium, quartz, etc. Thus, as used herein, the term substrate 202 refers to a foundation upon which various superconducting structures can be built.

There is a superconducting first metal 204 on top of the substrate 202. In one embodiment, the first metal layer 204 is niobium (Nb). There is a second metal layer 208 on top of the first metal layer 204. In one embodiment, the second metal layer 208 is aluminum (Al). There is a superconducting alloy 206 of the first metal layer and the second metal layer between the first metal layer 204 and the second metal layer 208. For example, the superconducting alloy may be niobium aluminide $Al_3Nb$. As used herein, the term niobium aluminides includes all stable aluminides present in a Nb—Al diagram. Niobium aluminide refers to any alloy of Al and Nb. Here three phases are possible: $Al_3Nb$, $AlNb_2$ and $Nb_3Al$ (i.e., the only three niobium aluminide phases present in the binary Nb—Al equilibrium phase diagram). Note, in embodiments having very thin films, it is possible that a non-stable Al—Nb phase could form with a crystal structure and composition not found in bulk phases.

In various embodiments, different grain orientations of the $Al_3Nb$ can be provided based on temperature and time conditions, discussed in more detail later. Significantly, there is no oxide layer between the superconducting alloy and the first metal layer 204 and the superconducting alloy 206. Additionally, in one embodiment, there is no oxide layer between the second metal layer 208 and the superconducting alloy 206.

Superconducting circuit elements, such as, without limitation, JJs, resonators, coupling pads, capacitor, gate electrodes, etc., are typically capped with a second conductor. In one embodiment, the second conductor (i.e., second metal layer 208) is deposited on the first conductor (i.e., first metal layer 204) before the first metal layer 204 is exposed to air to prevent oxidation thereon.

Alternatively, or in addition, the top surface of the first metal layer 204 is sufficiently cleaned before the second metal layer 208 is deposited. The two conducting layers comprising the first metal layer 204 and the second metal layer 208 are alloyed at their interface to create an electrical path from the base conductor (i.e., first metal layer 204), through the superconducting alloy 206 and into the JJ electrode, represented in FIG. 2 by the second metal layer 208. By virtue of not having an oxide layer between the metal layers 204 and 208, as well as the superconducting alloy 206, the quality of the contact improves (e.g., contact between the capacitor pad, represented by the second metal layer 208, and the JJ 208 lead, for reduced loss), thereby producing a more ideal JJ. In various embodiments metal layer 208 can be a metal that is only used for creating the interfacial alloy 206, in which case an electrode is deposited later. Alternatively, metal layer 208 could also be one (or even a double layer electrode) that is annealed later to form the superconducting alloy 206. In some embodiments, the superconducting circuit is built before the anneal to form the interfacial alloy 206.

Example Processes for Superconducting Structures

Figure 3A:
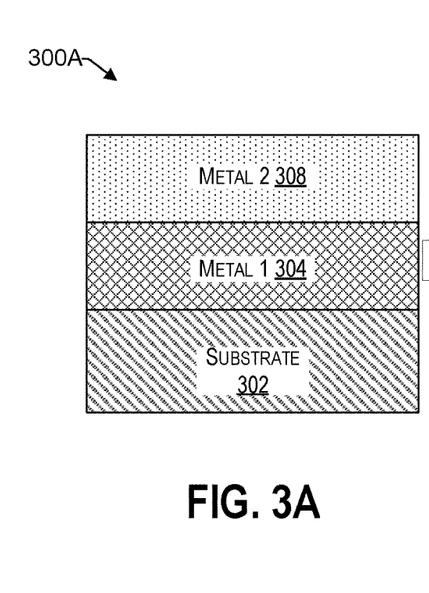
FIG. 3A shows a semiconductor structure before formation of a superconducting alloy between metal layers, consistent with an illustrative embodiment.

With the foregoing description of an example superconductor structure 200, it may be helpful to discuss an example process of manufacturing the same. To that end, FIGS. 3A to 3D illustrate various steps in the manufacture of a superconductor structure, consistent with illustrative embodiments. More specifically, FIG. 3A illustrates a semiconductor structure 300A before formation of a superconducting alloy between metal layers, consistent with an illustrative embodiment. In various embodiments, the base first metal layer 304 is capped with the second metal layer 308 (i) either before air exposure or (ii) after air exposure, after which the native metal oxide is sufficiently removed before the second metal layer 308 coverage, collectively referred to herein as rejecting the native metal oxide. For example, in various embodiments, the second metal layer 308 is placed on top of the first metal layer 304 before oxidation occurs (e.g., while the chip is in a controlled environment, such as a vacuum, even when going from one deposition chamber to another) or by a sufficient cleaning of the top surface of the first metal layer 304 to remove any oxidation thereon before the second metal layer 308 is placed on top of the first metal layer 304.

In various embodiments, this cleaning of the oxide from a top surface of the first metal layer 304 may be by way of wet clean or dry clean (preferred). Such dry cleaning may include, without limitation, ion milling, pre-sputter, or another appropriate technique to remove the oxide from the top of the first metal layer 304. In this way, an interface without oxidation can be achieved. Accordingly, the interface between the first metal layer 304 and the second metal layer 308 is substantially free of oxide. A superconducting alloy is then formed between the two metal layers 304 and 308, as discussed in more detail below.

Figure 3B:
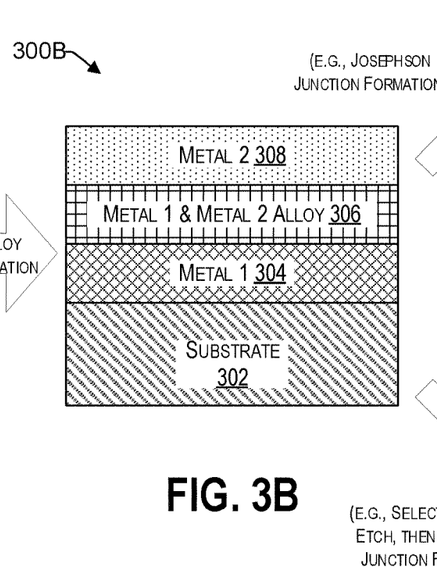
FIG. 3B illustrates a semiconductor structure after a superconducting alloy is formed between the first metal layer and the second metal layer, consistent with an illustrative embodiment.

FIG. 3B illustrates a semiconductor structure 300B after a superconducting alloy 306 is formed between the first metal layer 304 and the second metal layer 308, consistent with an illustrative embodiment. In one embodiment, the superconducting alloy is formed by way of anneal. Other ways of creating the superconducting alloy 306 between the first metal layer 304 and the second metal layer 308 include, without limitation, a predetermined amount of pressure, and/or an increase of bias during the deposition of the second metal layer 308.

In one embodiment, the first metal layer 304 is niobium (Nb), the second metal layer 308 is aluminum (Al) and the resulting alloy 306 between these two metals is niobium aluminide $Al_3Nb(002)$, where (002) is the lattice orientation of the superconducting alloy 306 with respect to the 110 planes of the Nb and in this case the surface of the substrate In various embodiments, depending on the different superconducting structure that is to be created, the second metal layer 308 can be kept or etched away by way of wet or dry (plasma) etching. Thus, the unreacted second metal layer 308 can remain or be removed, selectively leaving the metal alloy 306 exposed, where the metal alloy 306 protects the first metal layer 304 from reactions with the ambient environment. By virtue of creating the metal alloy 306, the first metal layer 304 is protected from oxidation or other elements that could affect the performance of the superconductor devices of the first metal layer 304, thereby improving device performance.

Figure 3C:
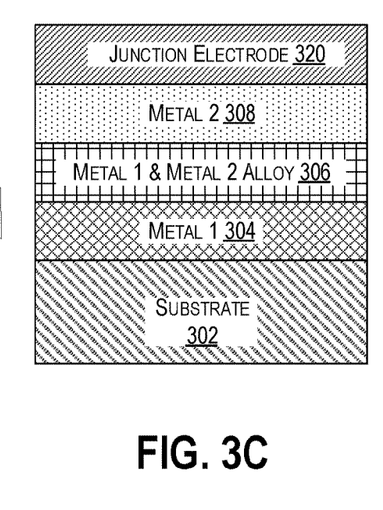
FIG. 3C shows a semiconductor structure that includes an electrode on top of the second metal layer, consistent with an illustrative embodiment.
Figure 3D:
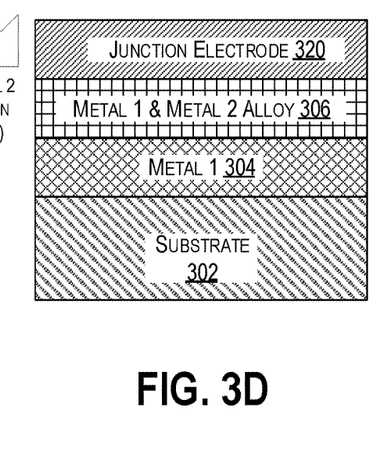
FIG. 3D shows a semiconductor structure includes an electrode directly on a superconducting alloy, consistent with an illustrative embodiment.

FIGS. 3C and 3D illustrate a semiconductor structures 300C and 300D that include an electrode 320 on top of the second metal layer 308, and one directly on the superconducting alloy 306, respectively, consistent with illustrative embodiments. For example, the junction electrode 320 may belong to a JJ. The JJ could be on the capacitor (i.e. formed by a subtractive etch) or on the substrate which is connected to the capacitor by the junction electrode (i.e. Dolan shadow junction build). Trilayer junction processes can be used, for example, for the fabrication of JJ logic devices and integrated circuits. For example, the junction electrode 320 would have a thin layer of oxide on top of it, which would be covered by another metal layer to provide the trilayer configuration (e.g., JJ on the capacitor).

Figure 4:
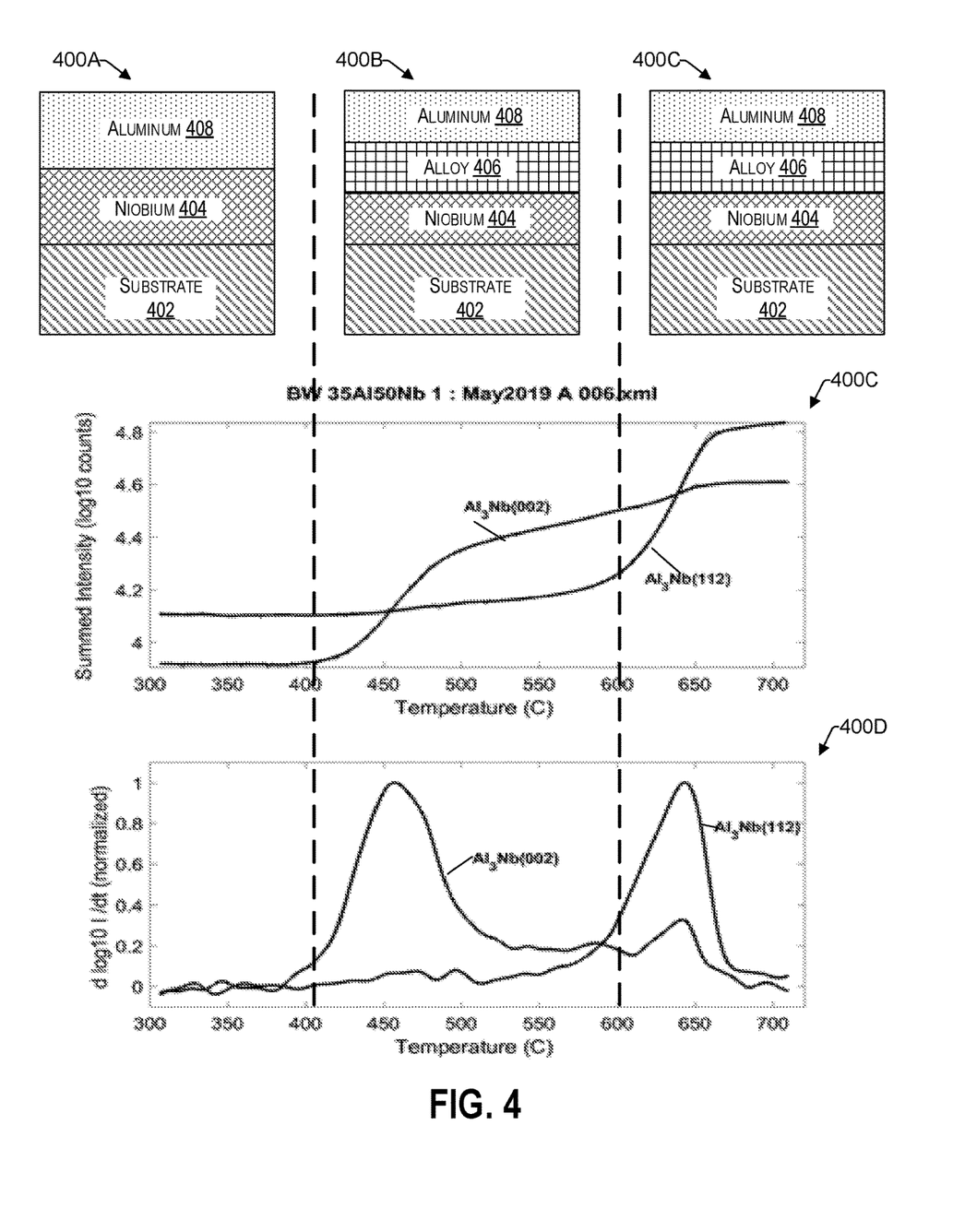
FIG. 4 shows a formation of a superconducting alloy having a different orientation based on the anneal temperature, consistent with an illustrative embodiment.

Reference now is made to FIG. 4, which illustrates the formation of a superconducting alloy 406 having a different orientation based on the anneal temperature, consistent with an illustrative embodiment. For discussion purposes, and not by way of limitation, the original semiconductor structure 400A has a first metal layer 404 comprising niobium (Nb) and a second metal layer 408 comprising aluminum (Al) that are placed on top of a substrate 402. X-Ray diffraction intensity charts 400C and 400D (with reference to structure 400B) indicate that at around a temperature of 500 C, a superconducting alloy 406 is formed at an interface between the niobium layer 404 and the aluminum layer 408. The superconducting alloy 406 (i.e., $Al_3Nb$) has a lattice structure that may be oriented differently with the substrate based on different anneal temperatures. The desired orientation for optimal contact can be controlled by the annealing condition.

Different temperatures will form different alloy thicknesses. For example a thin layer of $Al_3Nb(002)$ forms below 400 C with long anneal time, and will grow over time. When the temperature is increased (e.g., 650 C) the superconducting alloy 406 starts to include grains exhibiting different orientations ($Al_3Nb(112)$ and (101)) as the grains in the film become more randomly oriented. In some embodiments, similar results can be achieved with different combinations of temperature and time. For example, a lower temperature but longer anneal time, sometimes referred to herein as isothermal anneal, can also be used to achieve the superconducting alloy $Al_3Nb(002)$. Applicants have determined that an anneal temperature from 350 C to 500 C for an Nb/Al interface creates a superconducting alloy $Al_3Nb$ having an 002 alignment with respect to the underlying Nb 110 planes.

It is noted that Nb 404 and Al 408 form a superconducting alloy 406 at greater than 350 C when in direct contact. Alloying Nb 404 and Al 408 will form an electrical path from Nb to Al through a Nb and Al alloy 406. In one embodiment, no oxygen is present at the Nb 404 and Nb—Al alloy 406 interface, and only some oxygen is present on the surface of the Al layer 408. Accordingly, there is no residual Nb oxide to cause decoherence, thereby substantially increasing superconductor device performance.

Figure 5A:
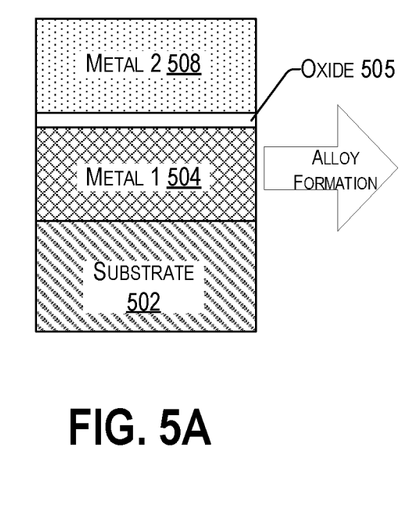
FIGS. 5A to 5D show different processing steps of creating a superconductor structure that includes an initial oxide layer between first and second metal layers, consistent with an illustrative embodiment.

The foregoing discussion is generally related to avoiding an oxygen layer between the first metal layer (e.g., Nb) and the second metal layer (e.g., Al). It should be noted that when native niobium oxide is present between the two metal layers, a superconducting alloy can still form under certain conditions, but not as rapidly. In this regard, reference is made to FIGS. 5A to 5D that provide different processing steps of creating a superconductor structure that includes an initial oxide layer between first and second metal layers 504 and 508, consistent with an illustrative embodiment. As illustrated in FIG. 5A, there is a first metal layer 504 (e.g., Nb) on top of a substrate 502. There is a second metal layer (e.g., Al) 508 on top of the first metal layer 504. There is a native oxide layer (e.g., niobium oxide) 505 between the metal layers 508 and 504.

Figure 5B:
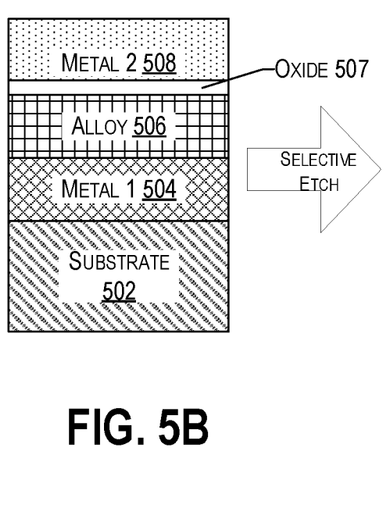

FIG. 5B illustrates that during alloy formation (e.g., by anneal), the native oxide 505 moves away from the niobium surface to the superconducting alloy 506 surface, represented by oxide layer 507.

Figure 5C:
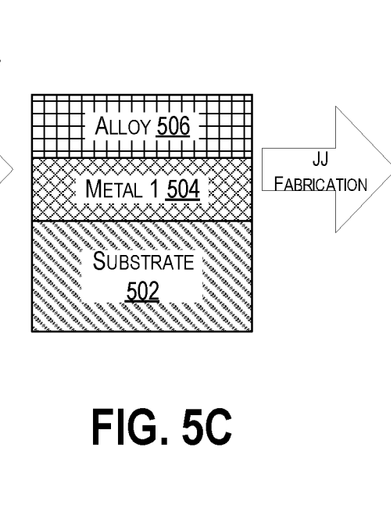
Figure 5D:
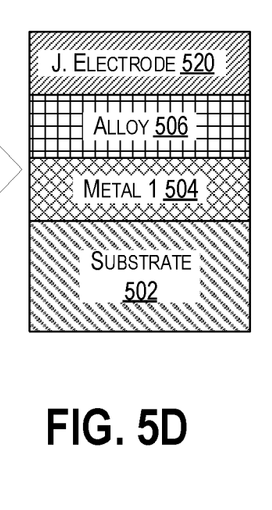

FIG. 5C illustrates that a selective etch and can remove the second metal layer 508 and the oxide layer 510. In various embodiments, both the second metal layer 508 and the oxide layer 507 can be removed concurrently or separately by different etch steps. An electrode (e.g., Josephson) 520 can then be deposited on top of the superconducting alloy 506. For example, the selective etch and aluminum JJ fabrication result in an electrical path from Nb to Al through Nb and Al alloy without niobium oxide defects.

Accordingly, Applicants have determined that while a superconducting alloy between the metal layers having no oxide (e.g., niobium oxide) layer between the metal layers can be achieved without an aggressive prevention and/or removal of the oxide layer between the first and second metal layers 504 and 508, such processing takes a substantial amount of more fabrication time and/or temperature to create the protective alloy 506. While the discussion herein may refer to the idealized term "having no oxide," it will be understood that it includes the meaning that it is substantially free of oxygen such that it would be very difficult to detect with known tools.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A superconductor device, comprising:
   a substrate;
   a first metal layer on top of the substrate;
   a second metal layer on top of the first metal layer;
   an electrode on top of the second metal layer; and
   a superconducting alloy of the first metal layer and the second metal layer between the first metal layer and the second metal layer,
   wherein there is no oxide layer between the superconducting alloy and the first metal layer.

2. A superconductor device, comprising:
   a substrate;
   a first metal layer on top of the substrate;
   a second metal layer on top of the first metal layer; and
   a superconducting alloy of the first metal layer and the second metal layer between the first metal layer and the second metal layer, wherein:
   there is no oxide layer between the superconducting alloy and the first metal layer;
   the first metal layer is Niobium (Nb);
   the second metal layer is Aluminum (Al); and
   the superconducting alloy is $Al_3Nb$.

3. The superconductor device of claim 2, wherein an orientation of crystal grains of the superconducting alloy is substantially aligned with a (002) plane parallel to a surface of the substrate.

4. The superconductor device of claim 1, wherein the electrode is an electrode of a Josephson Junction.

5. The superconductor device of claim 1, wherein the superconducting alloy is operative to protect the first metal layer from oxidation or contamination that could affect a performance of the superconductor device.

6. A method of fabricating a superconductor device, comprising:
   providing a substrate;
   providing a first metal layer on top of the substrate;
   rejecting an oxidation of a top surface of the first metal layer;
   depositing a second metal layer on top of the first metal layer;
   depositing an electrode on top of the second metal layer; and
   creating a superconducting alloy of the first metal layer and the second metal layer between the first metal layer and the second metal layer, wherein there is no oxide layer between the superconducting alloy and the first metal layer.

7. The method of claim 6, further comprising etching away the second metal layer after the creation of the superconducting alloy.

8. The method of claim 6, wherein the creation of the superconducting alloy comprises annealing the first metal layer and the second superconductor metal at a predetermined temperature.

9. The method of claim 6, wherein the superconducting alloy creates an electrical path from the first metal layer to the second metal layer.

10. The method of claim 6, wherein:
    the first metal layer is Niobium (Nb);
    the second metal layer is Aluminum (Al); and
    the superconducting alloy is $Al_3Nb$.

11. The method of claim 10, wherein an orientation of a lattice of the superconducting alloy is (002), (112), or (101), depending on a temperature of an anneal of the first metal layer and the second metal layer.

12. The method of claim 6, wherein the electrode is an electrode of a Josephson Junction.

13. The method of claim 6, further comprising:
    removing the second metal layer; and
    depositing an electrode on top of the superconducting alloy.

14. A method of fabricating a superconductor device, comprising:
    providing a substrate;
    providing a first metal layer on top of the substrate;
    providing an initial oxide layer on a top surface of the first metal layer;
    depositing a second metal layer on top of the second metal layer;
    creating a superconducting alloy of the first metal layer and the second metal layer between the first metal layer and the second metal layer; and
    moving the initial oxide layer to a top surface of the superconducting alloy during the creation of the superconducting alloy, wherein:
    the first metal layer is Niobium (Nb);

the second metal layer is Aluminum (Al); and
the superconducting alloy is $Al_3Nb$.

15. The method of claim 14, further comprising:
removing the initial oxide on the top surface of the superconducting alloy and the second metal layer; and
depositing an electrode on top of the superconducting alloy.

* * * * *